(12) United States Patent
Komatsu et al.

(10) Patent No.: US 7,687,874 B2
(45) Date of Patent: Mar. 30, 2010

(54) SURFACE ILLUMINATED PHOTODIODE AND OPTICAL RECEIVER MODULE

(75) Inventors: Kazuhiro Komatsu, Yokohama (JP); Yasushi Sakuma, Tokyo (JP); Daisuke Nakai, Yokohama (JP); Kaoru Okamoto, Yokohama (JP); Ryu Washino, Chigasaki (JP)

(73) Assignee: Opnext Japan, Inc. (JP)

( * ) Notice: Subject to any disclaimer, the term of this patent is extended or adjusted under 35 U.S.C. 154(b) by 269 days.

(21) Appl. No.: 11/702,203

(22) Filed: Feb. 5, 2007

(65) Prior Publication Data
US 2008/0006895 A1    Jan. 10, 2008

(30) Foreign Application Priority Data
Jul. 4, 2006    (JP) .............................. 2006-184303

(51) Int. Cl.
*H01L 31/105* (2006.01)
*H01L 29/868* (2006.01)

(52) U.S. Cl. .................. 257/458; 257/188; 257/189; 257/441; 257/464; 257/E31.061; 257/E29.336

(58) Field of Classification Search .................. 257/188, 257/189, 441, 464, 458, E29.336, E31.061
See application file for complete search history.

(56) References Cited

U.S. PATENT DOCUMENTS

| | | | | |
|---|---|---|---|---|
| 5,045,908 A | * | 9/1991 | Lebby ........................ 257/458 |
| 5,285,080 A | * | 2/1994 | Abe et al. ...................... 257/23 |
| 5,448,099 A | * | 9/1995 | Yano ........................... 257/452 |
| 6,750,075 B2 | * | 6/2004 | Razeghi ........................ 438/48 |
| 7,309,903 B2 | * | 12/2007 | Tanaka et al. ................ 257/421 |
| 2005/0012030 A1 | * | 1/2005 | Mahajan et al. .......... 250/214.1 |
| 2006/0261381 A1 | * | 11/2006 | Chiou ........................ 257/257 |
| 2007/0235758 A1 | * | 10/2007 | Klipstein .................... 257/188 |

FOREIGN PATENT DOCUMENTS

| | | |
|---|---|---|
| JP | 5-082827 | 4/1993 |
| JP | 8-032097 | 2/1996 |

\* cited by examiner

*Primary Examiner*—Victor A Mandala
(74) *Attorney, Agent, or Firm*—Mattingly & Malur, P.C.

(57) ABSTRACT

In a mesa type PIN-PD formed using a heavily doped semiconductor material, a high frequency response is degraded as slow carriers occur in a heavily doped layer when light incident into a light receiving section transmits through an absorbing layer and reaches the heavily doped layer on a side near the substrate. In a p-i-n multilayer structure, a portion corresponding to a light receiving section of a heavily doped layer on a side near a substrate is previously made thinner than the periphery of the light receiving section by an etching or selective growth technique, over which an absorbing layer and another heavily doped layer are grown to form the light receiving section of mesa structure. This makes it possible to form a good ohmic contact and to realize a PIN-PD with excellent high frequency response characteristics.

3 Claims, 4 Drawing Sheets

SURFACE ILLUMINATED PHOTODIODE AND OPTICAL RECEIVER MODULE

CLAIM OF PRIORITY

The present application claims priority from Japanese patent application serial no. 2006-184303, filed on Jul. 4, 2006, the content of which is hereby incorporated by reference into this application.

BACKGROUND OF THE INVENTION

The present invention relates to a surface illuminated photodiode and an optical receiver module on which the surface illuminated photodiode is mounted. More particularly, the invention relates to a surface illuminated photodiode appropriate for use in a module for optical communication and to an optical receiver module appropriate for use in an optical communication system.

There has been put into practice a p-i-n type photodiode (PIN-PD) as a device on the receiving side for optical transmission using an optical fiber. The PIN-PD is excellent in high frequency response as electrons and holes, which are generated due to incident light, move by strong drift field in an absorbing layer.

The basic structure of the PIN-PD is that an absorbing layer (I layer) is provided between a p-type cap layer and p-type contact layer, and an n-type contact layer. The principal of operation of the PIN-PD is that light incident into a reverse biased PD is converted to carriers (electrons and holes) in a depleted absorbing layer in which the holes spread and run to a p-electrode side and the electrons spread and run to an n-electrode side, and that the carrier is taken out as a current.

In the PIN-PD described in JP-A No. 32097/1996 and JP-A No. 82827/1993, a semiconductor material having an energy band gap larger than the absorbing layer is used for a p-type or n-type heavily doped layer.

In the technology described in JP-A No. 32097/1996 or JP-A No. 82827/1993, an accumulation (pile up) of carriers may occur due to heterojunction in which the energy band gap of the p-type or n-type semiconductor layer is larger than the absorbing layer (I layer). It is disadvantageous that high frequency response is degraded when the pile up occurs. To overcome this problem, there is also developed a mesa type PIN-PD having a p-type or n-type semiconductor layer formed using a heavily doped semiconductor material in which the energy band gap is equal to that of the absorbing layer or the difference therebetween is very small for the purpose of preventing the accumulation of carriers. However, such a PIN-PD has a problem that the high frequency response is degraded as slow carriers occur in the heavily doped layer when light incident into a light receiving section transmits through the absorbing layer and reaches the heavily doped layer on the side near the substrate. Although there may be a method of thinning the heavily doped layer to reduce the occurrence of such slow carriers, it is not easy to realize from the point of view of the etching accuracy and controllability of thickness in the formation of a mesa structure.

SUMMARY OF THE INVENTION

In a p-i-n multilayer structure, a portion corresponding to a light receiving section of a heavily doped layer on a substrate side is previously made thinner than the periphery of the light receiving section by an etching or selective growth technique, over which an absorbing layer and another heavily doped layer are grown to form the light receiving section of mesa structure. The heavily doped layer corresponding to the light receiving section is thin, so that the optical absorption of incident light transmitted through the absorbing layer is reduced in the heavily doped layer. The controllability of the thickness of the heavily doped layer is also ensured around the light receiving section during mesa formation. This makes it possible to form a good ohmic contact. As a result, it is possible to obtain a photodiode with excellent high frequency response characteristics.

An optical receiver module having excellent high frequency response characteristics can be obtained by applying this photodiode to the optical receiver module.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1A:
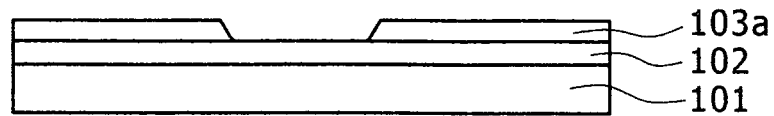
FIGS. 1A to 1D are cross-sectional views each illustrating a photodiode manufacturing process.

Hereinafter modes for carrying out the present invention will be described using the embodiments with reference to the accompanying drawings. Substantially like parts are denoted by like reference numerals and the description thereof will not be repeated. Further, hatching is not daringly applied to the cross sections in the cross-sectional views. This is to avoid complexity of illustration.

Embodiment 1

Figure 2:
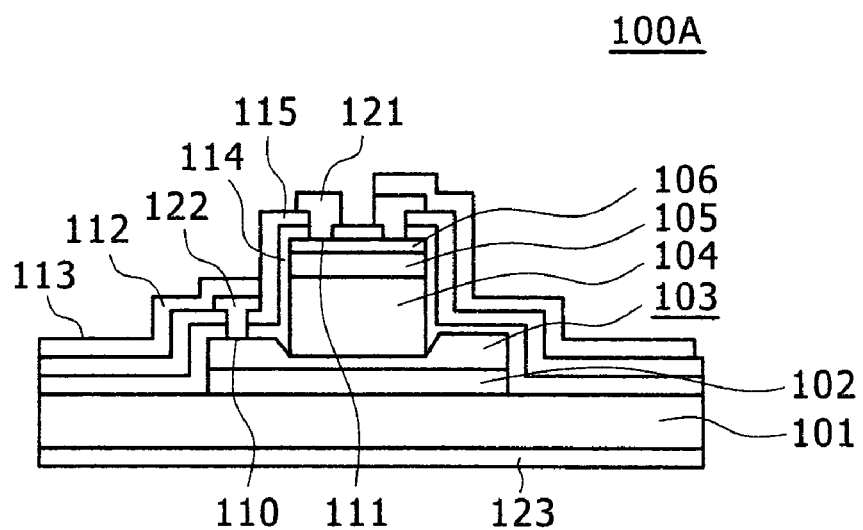
FIG. 2 is a cross-sectional view of a photodiode.
Figure 3:
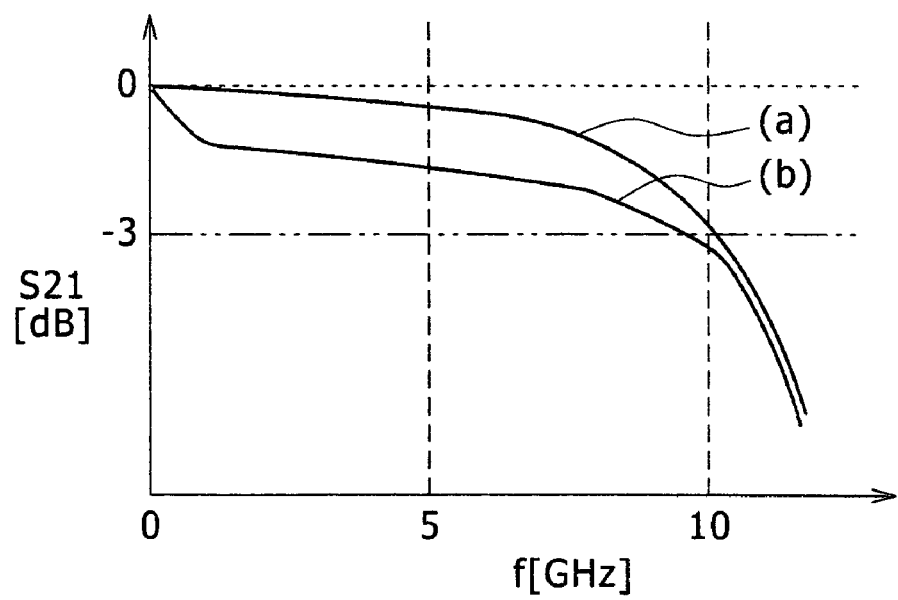
FIG. 3 is a view illustrating the characteristics of high frequency response of the photodiode.
Figure 4:
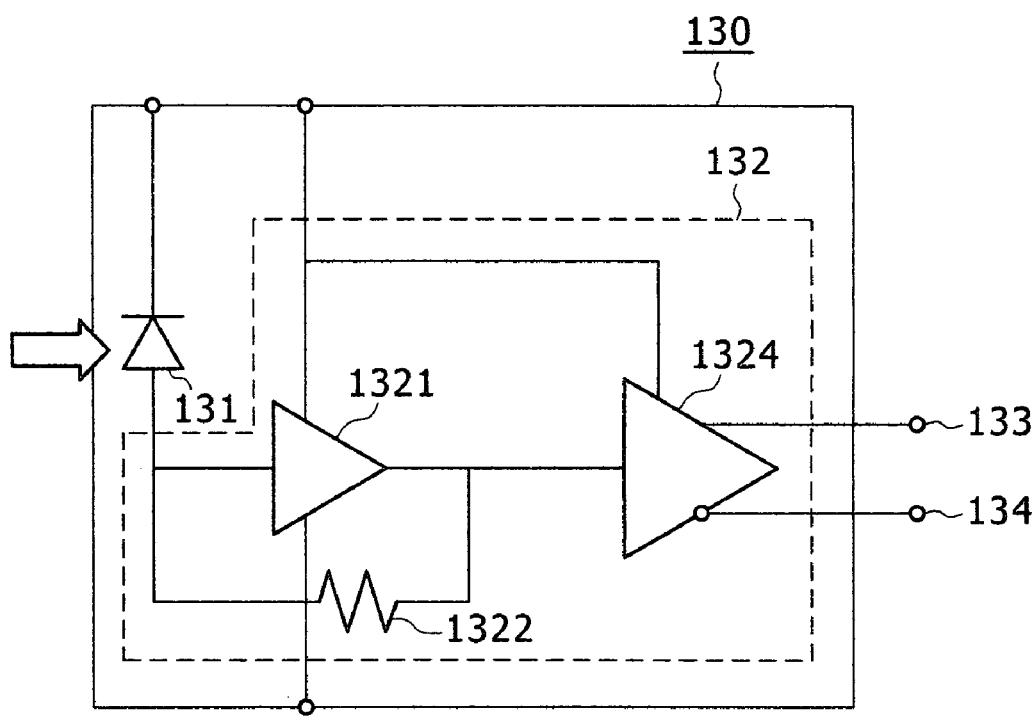
FIG. 4 is a block diagram of an optical receiver module.

A photodiode according of the embodiment 1 will be described with reference to FIGS. 1A-1D to FIG. 4. Here FIGS. 1A to 1D are cross-sectional views each illustrating a photodiode manufacturing process. FIG. 2 is a cross-sectional view of a photodiode. FIG. 3 is a view illustrating the characteristics of high frequency response of the photodiode. FIG. 4 is a block diagram of an optical receiver module.

The photodiode is obtained, as shown in FIG. 1A, by forming an InP buffer layer (undope, film thickness of 0.2 μm) 102 and an n-type InGaAsP contact layer (n type, impurity concentration: $1\times10^{18}$ cm$^{-3}$ ($1\times10^{18}$ cm$^{-3}$), film thickness of 0.4 μm, Eg=0.8 eV) 103a over a semi-insulating InP substrate 101 by the Metal Organic Chemical Vapor Deposition method, followed by etching the InGaAsP contact layer 103a only in a light receiving section to the InP buffer layer 102 by use of a mixed acid of sulfuric, hydrogen peroxide, and water (first multilayer growth).

Figure 1B:
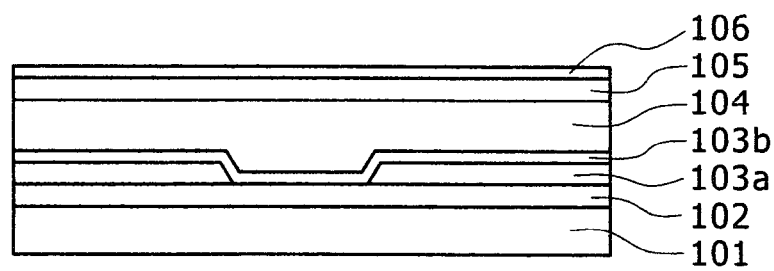

Subsequently as shown in FIG. 1B, an n-type InGaAsP contact layer (n type, impurity concentration: $1\times10^{18}$ cm$^{-3}$, film thickness of 0.3 μm, Eg=0.8 eV) 103b, an Images absorbing layer (undope, impurity concentration: $5\times10^{14}$ cm$^{-3}$, film thickness of 1.5 μm, Eg=0.75 eV) 104, an InGaAsP cap layer (p type, impurity concentration: $1\times10^{18}$ cm$^{-3}$, film thickness of 0.1 μm, Eg=0.8 eV) 105, and an InGaAs contact layer (p type, impurity concentration: $1\times10^{19}$ cm$^{-3}$, film thickness of 0.1 μm, Eg=0.75 eV) 106 are regrown by the Metal Organic Chemical Vapor Deposition method (second multilayer growth).

Figure 1C:
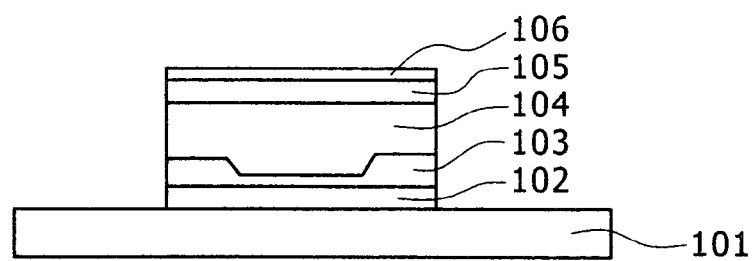

As shown in FIG. 1C, wet etching is performed from the InGaAs contact layer 106 of the periphery of a circular light receiving section to the InP buffer layer 102 by use of a mixed acid of phosphoric acid and sulfide (first mesa formation).

Figure 1D:
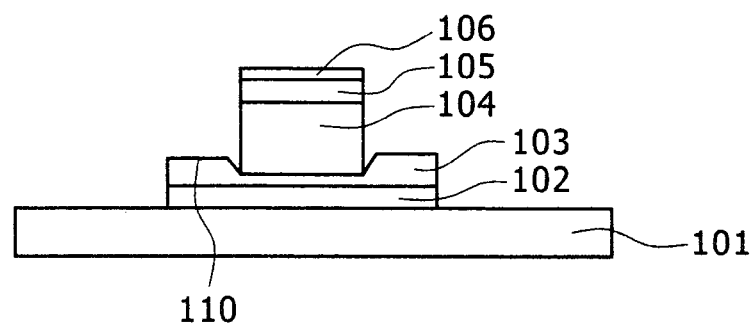

Next as shown in FIG. 1D, the light receiving section is formed by further wet etching the n-type InGaAsP contact layer 103a and the InP buffer layer 102 roundly in the periphery of the light receiving section in order to reduce capacitance, leaving an n-type contact portion 110 of a surface of the n-type InGaAsP contact layer 103a by use of a phosphoric acid etchant (second mesa formation).

Referring to FIG. 2, an SiN film (film thickness of 0.2 μm) 114 and an SiO2 film (film thickness of 0.8 μm) 115 are formed as protective films by a spatter or CVD method. Subsequently the following processes are performed: a partial etching process of the protective films (SiN/SiO2) for contact with the heavily doped semiconductor layer; a partial etching process of the SiO2 film 115 to make the SiN film of the light receiving section a reflection protective film; a formation process of a p-electrode 121 and an n-electrode 122 formed by an electron beam evaporation technique; a grinding process of the bottom of the substrate; and a formation process of a bottom electrode 123. In this way a p-i-n type photodiode 100A was manufactured.

The film thickness of a heavily doped contact layer 103 of the light receiving section on the side near the substrate of a surface illuminated photodiode portion shown in the center of FIG. 2 is formed thinner than the film thickness of the periphery of the light receiving section.

In FIG. 3, the abscissa is the frequency and the ordinate is the S21 characteristics. Characteristics (a) of FIG. 3 were obtained from an estimation of the frequency response characteristics of the photodiode 100A. Characteristics (b) of FIG. 3 are the characteristics of a photodiode with no difference in the film thickness of the n-type contact layer between the light receiving section and the periphery thereof. The characteristics (b) of FIG. 3 show that gain reduction occurs in a low frequency area in which slow carriers are generated in the n-type contact layer by the transmitted light that is not completely absorbed in the absorbing layer as the film thickness of the n-type contact layer is uniform.

On the other hand, it is seen from the characteristics (a) of FIG. 3 that the amount of gain degradation can be reduced in the low frequency area and that the frequency characteristics are improved also in a high frequency area. With respect to the n-type contact portion of the periphery of the light receiving section, there is a margin in the etching amount in the mesa formation with a 0.7-μm thick n+layer, so that a heavily doped layer with a thickness of 0.5 μm or more can be left after etching, providing a sufficient low contact resistance of 1 ohm or less with good reproducibility.

In the embodiment 1, preferably the film thickness of the n-type heavily doped layer of the photodiode portion is in a range of 0.1 μm to 0.4 μm. Preferably the film thickness of the n-type heavily doped layer of the electrode portion is thicker than the film thickness of the photodiode portion by 0.1 μm or more. Further preferably the difference between the energy band gap of the n-type heavily doped layer and the energy band gap of the absorbing layer is within 0.2 eV.

In the embodiment 1, there are used InGaAsP as the n-type contact layer, InGaAs as the absorbing layer material, InGaAsP as the p-type cap layer, and InGaAs as the p-type contact layer. However it goes without saying that the same effect as the embodiment 1 is obtained in the case where any of the material systems, namely, InGaAs, InGaAsP, InGaAlAs, GaInNAs, or GaInNAsSb having an absorption end including a light-receiving wavelength range, is used for the p-i-n structure. Although the thicknesses and impurity concentrations of the growth layers are specifically described in the embodiment 1, it is also possible to employ a structure with another combination of thicknesses and concentrations depending on the applications as the photodiode, such as of high large, wavelength range, and large diameter. Also in this case the same effect can be expected.

Having described the top illuminated photodiode in the embodiment 1, a bottom illuminated photodiode can also be realized with the main part configuration equivalent to that of the top illuminated photodiode. This can be easily understood by those skilled in the art. The top illuminated photodiode and the bottom illuminated photodiode are both the surface illuminated photodiode.

FIG. 4 is an optical receiver module in which the photodiode of the embodiment 1 is mounted. An optical receiver module 130 shown in FIG. 4 is an optical receiver module in which a photodiode 100 is implemented together with a TIA (Trans Impedance Amplifier) with limiting amplifier 132. Here the TIA with limiting amplifier 132 includes a preamplifier 1321, a feedback resister 1322, and a limiting amplifier 1323, serving as a negative feedback amplifier for converting current input to voltage output. The optical receiver module 130 receives an optical signal indicated by the arrow, and outputs as an electric signal from an OUT1 terminal 133 which is the positive phase output of the TIA with limiting amplifier 132 and from an OUT2 terminal 134 which is the negative phase output thereof. The optical receiver module 130 has excellent high frequency response characteristics with less band degradation even in the case of low voltage and large input, due to a little or no difference in the energy band gap of the heterojunction between each of the layers in the multilayer structure.

Embodiment 2

Figure 5:
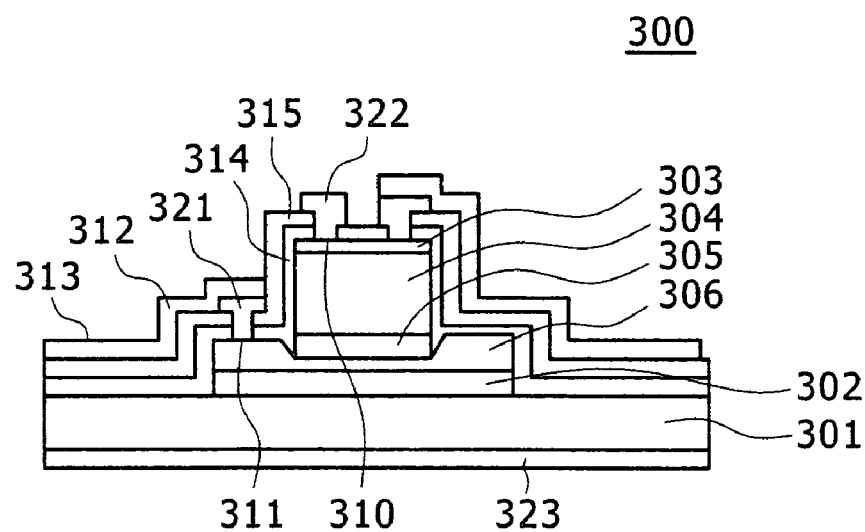
FIG. 5 is a cross-sectional view of a photodiode.

A photodiode of the embodiment 2 will be described with reference to FIG. 5. Here FIG. 5 is a cross-sectional view of a photodiode. Incidentally the details of the formation process of this photodiode are the same as those in the embodiment 1 and will be omitted.

In FIG. 5, a light receiving section of a heavily doped contact layer 306 is provided on the side near a substrate of a surface illuminated photodiode portion in a center of a photodiode 300. The light receiving section of the heavily doped contact layer 306 is formed thinner than the periphery of the light receiving section. An InP buffer layer (undope, film thickness of 0.2 μm) 302 and a p-type InGaAs contact layer (p type, impurity concentration: $1\times10^{19}$ cm$^{-3}$, film thickness of 0.4 μm, Eg=0.75 eV) 306 are formed over a semi-insulating InP substrate 301 by the Metal Organic Chemical Vapor Deposition method. Then the p-type InGaAs contact layer 306 is etched only in the light receiving section to the InP buffer layer 302.

Subsequently, using the Metal Organic Chemical Vapor Deposition method, the p-type InGaAs contact layer 306 is regrown followed by the regrowth of an InGaAlAs cap layer (p type, impurity concentration: $3\times10^{18}$ cm$^{-3}$, film thickness of 0.1 μm, Eg=0.8 eV) 305, InGaAs absorbing layer (undope, impurity concentration: $5\times10^{14}$ cm$^{-3}$, film thickness of 1.7 μm, Eg=0.75 eV) 304, and InGaAs contact layer (n type, impurity concentration: $7\times10^{18}$ cm$^{-3}$, film thickness of 0.1 μm, Eg=0.75 eV) 303.

In order to form the light receiving section from the multilayer structure described above, the InGaAlAs cap layer 305 is etched from the InGaAs contact layer 303 by wet etching. Further the p-type InGaAs contact layer 306 and the InP buffer layer 302 are etched in the periphery of the light receiving section. At this time, a surface of the p-type InGaAs contact layer 306 becomes a p-type contact portion 311. The etching of the p-type InGaAs contact layer 306 and InP buffer layer 302 is to reduce capacitance by providing a wire and a pad portion over the semi-insulating substrate through protective films.

Subsequently the following processes are performed: a formation process of an SiN film (film thickness of 0.2 μm) 314 and SiO2 film (film thickness of 0.8 μm) 315 as protective films by the spatter or CVD method; a through hole etching process of the protective films for contact with the heavily doped semiconductor layer; a partial etching process of the SiO2 film 315 to make the SiN film 314 of the light receiving section a reflection protective film; a formation process of a p-electrode 321 and n-electrode 322 by the electron beam evaporation technique; a substrate grinding process; and a formation process of a bottom electrode 323. In this way a p-i-n type photodiode 300 was manufactured.

In the embodiment 2, the frequency response characteristics were estimated and the same characteristics as in FIG. 3 were obtained. In other words, the amount of gain degradation was able to be reduced in the low frequency area. With respect to the p-type contact portion of the periphery of the light receiving section, there is a margin in the etching amount in the mesa formation with a 0.5-μm thick p+layer, so that a heavily doped layer with a thickness of 0.3 μm or more can be left after etching, providing a sufficient low contact resistance of 1 ohm or less with good reproducibility.

In the embodiment 2, preferably the film thickness of the p-type heavily doped layer of the photodiode portion is in a range of 0.1 μm to 0.4 μm. Preferably the film thickness of the p-type heavily doped layer of the electrode portion is thicker than the film thickness thereof in the photodiode portion by 0.1 μm or more. Further preferably the difference between the energy band gap of the p-type heavily doped layer and the energy band gap of the absorbing layer is within 0.2 eV.

In the embodiment 2, there are used InGaAsP as the n-type contact layer, InGaAs as the absorbing layer material, InGaAsP as the p-type cap layer, and InGaAs as the p-type contact layer. However it goes without saying that the same effect as the embodiment 2 is obtained in the case where any of the material systems, namely, InGaAs, InGaAsP, InGaAlAs, GaInNAs, or GaInNAsSb having an absorption end including a light receiving wavelength range, is used for the p-i-n structure. Although the thicknesses and concentrations of the growth layers are specifically described in the embodiment 2, it is also possible to employ a structure with another combination of thicknesses and concentrations depending on the applications as the photodiode, such as of high large, wavelength range, and large diameter. Also in this case the same effect can be expected.

Similarly to the embodiment 1, in the case where the photodiode of the embodiment 2 is implemented together with the TIA as the optical receiver module shown in FIG. 4, it is possible to realize an optical receiver module having excellent high frequency response characteristics with less band degradation even in the case of low voltage and large input, due to a little or no difference in the energy band gap of the heterojunction between each of the layers in the multilayer structure.

Embodiment 3

In the embodiments 1 and 2, the light receiving section of the heavily doped contact layer on the side near the substrate of the surface illuminated photodiode is formed thinner than the periphery of the light reception section by etching the heavily doped contact layers 103, 306 after the growth, followed by regrowing them. However, a similar structure can be formed by selective growth through the Metal Organic Chemical Vapor Deposition method using an oxide film or a nitride film. This will be described as the embodiment 3 with reference to FIG. 6. Here FIG. 6 is a cross-sectional view illustrating a photodiode manufacturing process.

Figure 6:
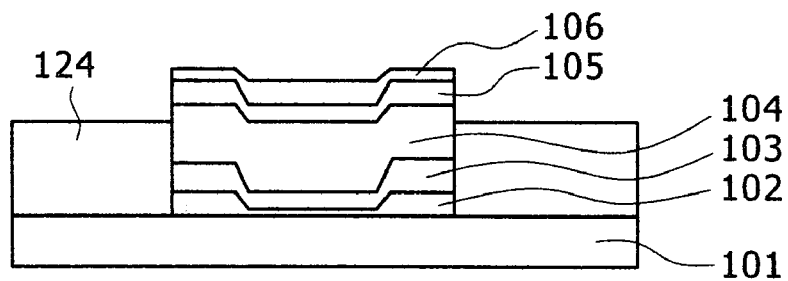
FIG. 6 is a cross-sectional view illustrating a photodiode manufacturing process.

During the process to a photodiode 100B of FIG. 6, a mask 124 of acid film having a round foramen is formed on the semi-insulation InP substrate 101 over which the InP buffer layer (undope, film thickness of 0.2 μm) 102, n-type InGaAsP contact layer (n type, impurity concentration: $1\times10^{18}$ $cm^{-3}$, film thickness of 0.3 μm, Eg=0.8 eV) 103, InGaAs absorbing layer (undope, impurity concentration: $5\times10^{14}$ $cm^{-3}$, film thickness of 1.5 μm, Eg=0.75 eV) 104, InGaAsP cap layer (p type, impurity concentration: $1\times10^{18}$ $cm^{-3}$, film thickness of 0.1 μm, Eg=0.8 eV) 105, and InGaAs contact layer (p type, impurity concentration: $1\times10^{19}$ $cm^{-3}$, film thickness of 0.1 μm, Eg=0.75 eV) 106 are formed by the Metal Organic Chemical Vapor Deposition method.

Subsequently, the photodiode is formed by a wafer process similar to the embodiments 1, 2 by use of this multilayer structure.

The embodiment 3 takes advantage of the fact that the film thickness is increased only in the periphery of the oxide film step portion in crystal growth by the Metal Organic Chemical Vapor Deposition method. It is grown within the mask 124 having the round foramen. As a result, the film thickness of the heavily doped contact layer in a central portion of the round foramen is thinner than the film thickness of the heavily doped contact layer in the portion of the round foramen near the mask. When the light receiving section of the surface illuminated photodiode is provided in the central portion of the round foramen, similarly to the embodiments 1 and 2, it is possible to reduce the amount of gain degradation in the low frequency area. It is also possible to obtain sufficient low contact resistance with good reproducibility.

Incidentally although the oxide film is used as the mask material having the round foramen in the embodiment 3, the nitride film may be used as well.

In the embodiment 3, the frequency response characteristics were estimated and the same characteristics as in FIG. 3 were obtained. In other words, the amount of gain degradation was able to be reduced in the low frequency area. With respect to the n-type contact portion of the periphery of the light receiving section, there is a margin in the etching amount in the mesa formation with a 0.5-μm thick n+layer, so that a heavily doped layer with a thickness of 0.3 μm or more can be left after etching, providing a sufficient low contact resistance of 1 ohm or less with good reproducibility.

Similarly to the embodiment 1, in the case where the photodiode of the embodiment 3 is implemented together with the TIA as the optical receiver module shown in FIG. 4, it is possible to realize an optical receiver module having excellent high frequency response characteristics with less band degradation even in the case of low voltage and large input, due to a little or no difference in the energy band gap of the heterojunction between each of the layers in the multilayer structure.

Embodiment 4

Figure 7A:
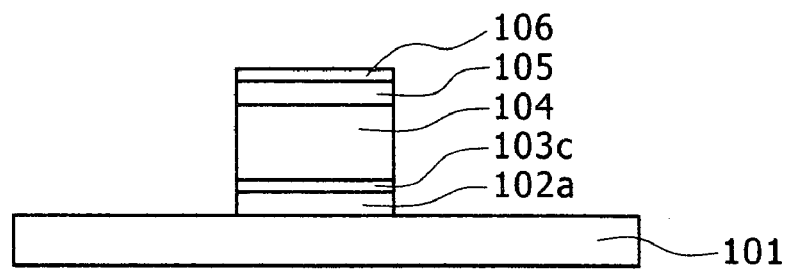
FIGS. 7A and 7B are cross-sectional views each illustrating a photodiode manufacturing process.
Figure 7B:
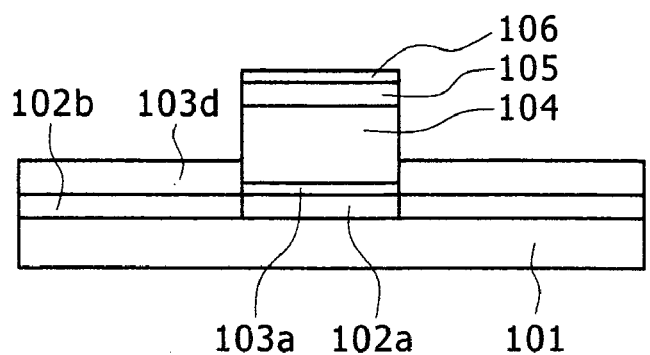

Referring to FIGS. 7A and 7B, there will be described another embodiment 4 in which a light receiving section of a heavily doped contact layer on the side near the substrate of the surface illuminated photodiode portion is formed thinner than the periphery of the light receiving section. Here FIGS. 7A and 7B are cross-sectional views each illustrating a photodiode manufacturing process.

During the process to a photodiode 100C of FIG. 7A, an InP buffer layer (undope, film thickness of 0.2 μm) 102a, an n-type InGaAsP contact layer (n type, impurity concentration: $1\times10^{18}$ cm$^{-3}$, film thickness of 0.3 μm, Eg=0.8 eV) 103c, the InGaAs absorbing layer (undope, impurity concentration: $5\times10^{14}$ cm$^{-3}$, film thickness of 1.5 μm, Eg=0.75 eV) 104, InGaAsP cap layer (p type, impurity concentration: $1\times10^{18}$ cm$^{-3}$, film thickness of 0.1 μm, Eg=0.8 eV) 105, and InGaAs contact layer (p type, impurity concentration: $1\times10^{19}$ cm$^{-3}$, film thickness of 0.1 μm, Eg=0.75 eV) 106 are formed over the semi-insulating substrate InP 101. Then a mesa shape of the light receiving section is formed by wet etching.

Subsequently, as shown in FIG. 7B, an InP buffer layer (undope, film thickness of 0.2 μm) 102b and an n-type InGaAsP contact layer (n type, impurity concentration: $1\times10^{18}$ cm$^{-3}$, film thickness of 0.7 μm, Eg=0.8 eV) 103d are regrown in an area other than the light receiving section by the Metal Organic Chemical Vapor Deposition method. Thus there is formed a structure in which the heavily doped contact layer is thinner in the light receiving section than in the periphery of the light receiving section. Then the light receiving section is formed by the wafer process similar to the embodiments 1, 2.

In the embodiment 4, the frequency response characteristics were estimated and the same characteristics as in FIG. 3 were obtained. In other words, the amount of gain degradation was able to be reduced in the low frequency area. With respect to the n-type contact portion of the periphery of the light receiving section, there is a margin in the etching amount in the mesa formation with a 0.5-μm thick n+layer, so that a heavily doped layer with a thickness of 0.3 μm or more can be left after etching, providing a sufficient low contact resistance of 1 ohm or less with good reproducibility.

Similarly to the embodiment 1, in the case where the photodiode of the embodiment 4 is implemented together with the TIA as the optical receiver module shown in FIG. 4, it is possible to realize an optical receiver module having excellent high frequency response characteristics with less band degradation even in the case of low voltage and large input, due to a little or no difference in the energy band gap of the heterojunction between each of the layers in the multilayer structure.

According to the present invention, it is possible to realize a photodiode and optical receiver module with excellent high frequency response characteristics for large input.

We claim:

1. A surface illuminated photodiode having a p-i-n multilayer structure including an n-type heavily doped layer, an absorbing layer, and a p-type heavily doped layer, over a semiconductor substrate in the order from the semiconductor substrate,
   wherein said n-type heavily doped layer has a first film thickness in a light receiving section, said n-type heavily doped layer has a second film thickness in an electrode portion in the vicinity of said light receiving section, and said first film thickness is thinner than said second film thickness, and
   wherein an energy band gap difference between said n-type heavily doped layer of said light receiving section and said absorbing layer is within 0.2 eV.

2. A surface illuminated photodiode having a p-i-n multilayer structure including an n-type heavily doped layer, an absorbing layer, and a n-type heavily doped layer, over a semiconductor substrate in the order from the semiconductor substrate,
   wherein said n-type heavily doped layer has a first film thickness in a light receiving section, said n-type heavily doped layer has a second film thickness in an electrode portion in the vicinity of said light receiving section, and said first film thickness is thinner than said second film thickness,
   wherein said n-type heavily doped layer mainly includes InGaAs, InGaAsP, InGaAlAs, GaInNAs, or GaInNAsSb, and
   wherein an energy band gap difference between said n-type heavily doped layer of said light receiving section and said absorbing layer is within 0.2 eV.

3. A surface illuminated photodiode having a p-i-n multilayer structure including an n-type heavily doped layer, an absorbing layer, and a p-type heavily doped layer, over a semiconductor substrate in the order from the semiconductor substrate,
   wherein said n-type heavily doped layer has a first film thickness in a light receiving section, said n-type heavily doped layer has a second film thickness in an electrode portion in the vicinity of said light receiving section, and said first film thickness is thinner than said second film thickness,
   wherein said first film thickness of said n-type heavily doped layer of said light receiving section is from 0.1 μm to 0.4 μm,
   said second film thickness of said n-type heavily doped layer of said electrode portion in the vicinity of said light receiving section is thicker than said first film thickness by 0.1 μm or more, and
   wherein an energy band gap difference between said n-type heavily doped layer of said light receiving section and said absorbing layer is within 0.2 eV.

* * * * *